(12) United States Patent
Reuther et al.

(10) Patent No.: US 6,699,425 B1
(45) Date of Patent: Mar. 2, 2004

(54) DEVICE AND METHOD FOR TRANSFERRING MICROSTRUCTURES

(75) Inventors: Frank Reuther, Rudolstadt (DE); Alf Springer, Milda (DE); Lutz Mueller, Jena (DE)

(73) Assignee: Jenoptik Aktiengesellschaft, Jena (DE)

( * ) Notice: Subject to any disclaimer, the term of this patent is extended or adjusted under 35 U.S.C. 154(b) by 0 days.

(21) Appl. No.: 09/744,109

(22) PCT Filed: Apr. 15, 2000

(86) PCT No.: PCT/EP00/03438

§ 371 (c)(1), (2), (4) Date: May 9, 2001

(87) PCT Pub. No.: WO00/73035

PCT Pub. Date: Dec. 7, 2000

(30) Foreign Application Priority Data

May 27, 1999 (DE) .......................... 199 25 175

(51) Int. Cl.⁷ .......................... B29C 59/02; G01B 11/02
(52) U.S. Cl. ...................... 264/408; 264/40.1; 264/293; 264/334; 264/335; 425/135; 425/385; 425/436 R; 425/437
(58) Field of Search ................. 264/40.1, 293, 264/334, 335, 408; 425/135, 385, 436 R, 437

(56) References Cited

U.S. PATENT DOCUMENTS 4,761,253 A * 8/1988 Antes .................. 264/40.1
5,337,151 A * 8/1994 Baxter et al.

FOREIGN PATENT DOCUMENTS

| DE | 42 05 944 A1 | 8/1993 |
| DE | 19648844 C1 * | 9/1997 |
| EP | 0618505 A1 * | 10/1994 |
| EP | 0807856 A1 * | 11/1997 |
| GB | 2 319 492 A | 5/1998 |

OTHER PUBLICATIONS

English Abstract of DE 42 05 944 A1 (Aug. 26, 1993).

* cited by examiner

Primary Examiner—Leo B. Tentoni
(74) Attorney, Agent, or Firm—Reed Smith LLP (57) ABSTRACT

A device and a method for transferring microstructures from a tool to a substrate which is to be structured. The device and method are intended to align the tool and the substrate in a mutually controlled manner. The device contains supports for the tool and the substrate which can be displaced in an opposing direction in relation to one another, resulting in an alteration of the distance between the tool and the substrate. A measuring system is provided which can be inserted between the supports, for measuring selected locations on at least one measuring plane. The direction of displacement of the supports is aligned vertically in relation to said measuring plane. The measuring system forms a fixed spatial relationship with the tool in a measuring position. The substrate can be aligned in relation to the tool. The method and device can be used for producing microstructured components.

21 Claims, 6 Drawing Sheets

DEVICE AND METHOD FOR TRANSFERRING MICROSTRUCTURES

BACKGROUND OF THE INVENTION a) Field of the Invention

The invention relates to the transfer of microstructures from a tool to a substrate which is to be structured, with supports for the tool and the substrate which can be adjusted in relation to one another in a direction resulting in an alteration of the distance between the tool and the substrate.

b) Description of the Related Art

A device of this type is known, for example, from DE 196 48 844 C1.

For transferring microstructures, it is known to press a molding tool into a moldable material, such as for example a layer of thermoplastic material, preferably under a vacuum and at a temperature above the softening temperature of the moldable material and, as a result, to produce three-dimensional structures with structure heights in the range of just a few nanometers up to several hundred micrometers.

A device suitable for this purpose, according to DE 196 48 844 C1, is capable of compensating for variations in thickness of molding tools and of moldable materials used, while ensuring high dimensional stability, and of ensuring different molding depths.

The device includes a chamber with a chamber part which is fixed to the framework and a chamber part which is adjustable, in which chamber the setting of the pressure and temperature conditions is linked to prescribed values of a force acting on the fixed chamber part.

It is disadvantageous in the case of this known device that the location at which the structures are to be transferred into the moldable material cannot be determined.

OBJECT AND SUMMARY OF THE INVENTION

It is therefore the primary object of the invention to ensure that the tool and the moldable material can be mutually aligned in a manner which can be monitored.

According to the invention, the object is achieved by a device for transferring microstructures from a tool to a substrate which is to be structured, with supports for the tool and the substrate which can be adjusted in relation to one another in a direction resulting in an alteration of the distance between the tool and the substrate, in that, for measuring selected locations in at least one measuring plane, in relation to which the direction of adjustment of the supports is directed vertically, a measuring system which can be pushed in between the supports and, when in a measuring position, is in a fixed spatial relationship with the tool is provided, and in that the substrate can be displaced parallel to the measuring plane for alignment with respect to the tool.

The support for the tool is contained in a first chamber part and the support for the substrate is contained in a second chamber part of a closable chamber, in which the transfer of the microstructures takes place by molding.

The chamber is advantageously designed as a vacuum chamber or can be filled with inert gas.

The measuring system includes various optical branches with image fields of different sizes, the magnification of a first optical branch permitting easy searching for the locations to be selected and that of a second optical branch permitting exact measurement of the selected locations in the measuring planes.

A transporting device which contains different drives for positions to be moved to one after the other is provided for the pushing in of the measuring system, a first drive undertaking the transport from a first position outside the chamber into a second position in the opened chamber and a second drive moving the measuring system into a position aligned in relation to the tool. The measurement can be performed without hindering the molding.

The data ascertained are used for activating a device for displacing the substrate with respect to the tool which is contained in the second chamber part. The device includes two sliding plates which lie one on top of the other, are movable in relation to each other parallel to the plane of the substrate adjustment and of which an upper sliding plate serves as a chamber-closing element.

The upper sliding plate can preferably be clamped to the lower sliding plate.

The upper sliding plate can, furthermore, support a first part of a heating and cooling unit, on which a securing means for the substrate is fastened.

For changing the height of the chamber, the chamber may have side wall parts which provide a seal towards the outside and are themselves adjustable in relation to one another in the direction of the adjustability of the chamber parts.

It is advantageous if the tool is enclosed on its circumferential surface by a cylindrical tool holder, which is fastened in the first chamber part to a plate-shaped body.

The plate-shaped body may be in connection with a second part of a heating and cooling unit.

For removing the molded material from the tool, the tool holder may be enclosed at the lateral surface by a demolding tool, which is displaceable with respect to the tool holder in the direction of the mutual adjustability of the supports for removing the substrate from the tool following the transfer of the microstructures.

To ensure great stability over time of individual systems of the device, the measuring system, the displacing device and the first chamber part may contain channels for a temperature-controllable fluid.

For establishing the fixed spatial relationship between the measuring system and the tool, hooks for hanging on correspondingly shaped hooks of the first chamber part are fastened to the measuring system in the upper region of the latter.

It is also advantageous if the substrate comprises a supporting layer and a moldable material applied to the latter.

A tool for transferring structures into the moldable material may also be applied to the supporting layer.

The subject matter of the invention also includes a method for transferring microstructures from a tool to a substrate which is to be structured, with supports for the tool and the substrate which can be adjusted in relation to one another in a direction resulting in an alteration of the distance between the tool and the substrate. A positioning, required for the locationally exact transfer of the microstructures, of the substrate which is to be structured with respect to the tool in a plane in relation to which the direction of adjustment of the supports is directed vertically is ascertained by correction values for the positioning, determined by the distance of the microstructure from a mark on the substrate, being formed from measured structure positions of transferred microstructures on a first structured substrate for at least one further substrate to be structured.

To increase the positioning accuracy further, on the first substrate the positions of the marks may be additionally ascertained before and after the transfer of the microstructures for forming correction values for the positioning.

If the positioning accuracy is to be improved still further, the positions of marks on the substrate holder may be determined as correction values before a substrate is placed onto the substrate holder.

Finally, it is also advantageous if, after the molding of each substrate, ascertained positions of the molded microstructures and of the marks are used as correction values for the positioning of the substrate which is to be respectively structured thereafter.

With the present invention, the unchangeable spatial arrangement of the tool in relation to the moldable material prescribed in the case of the known technical solutions by the structural design is no longer applicable and their mutual alignment is ensured with high precision by ascertainment and manipulation of the positional relationships.

The invention is to be explained in more detail below with reference to the drawings.

DESCRIPTION OF THE PREFERRED EMBODIMENTS

Figure 1:
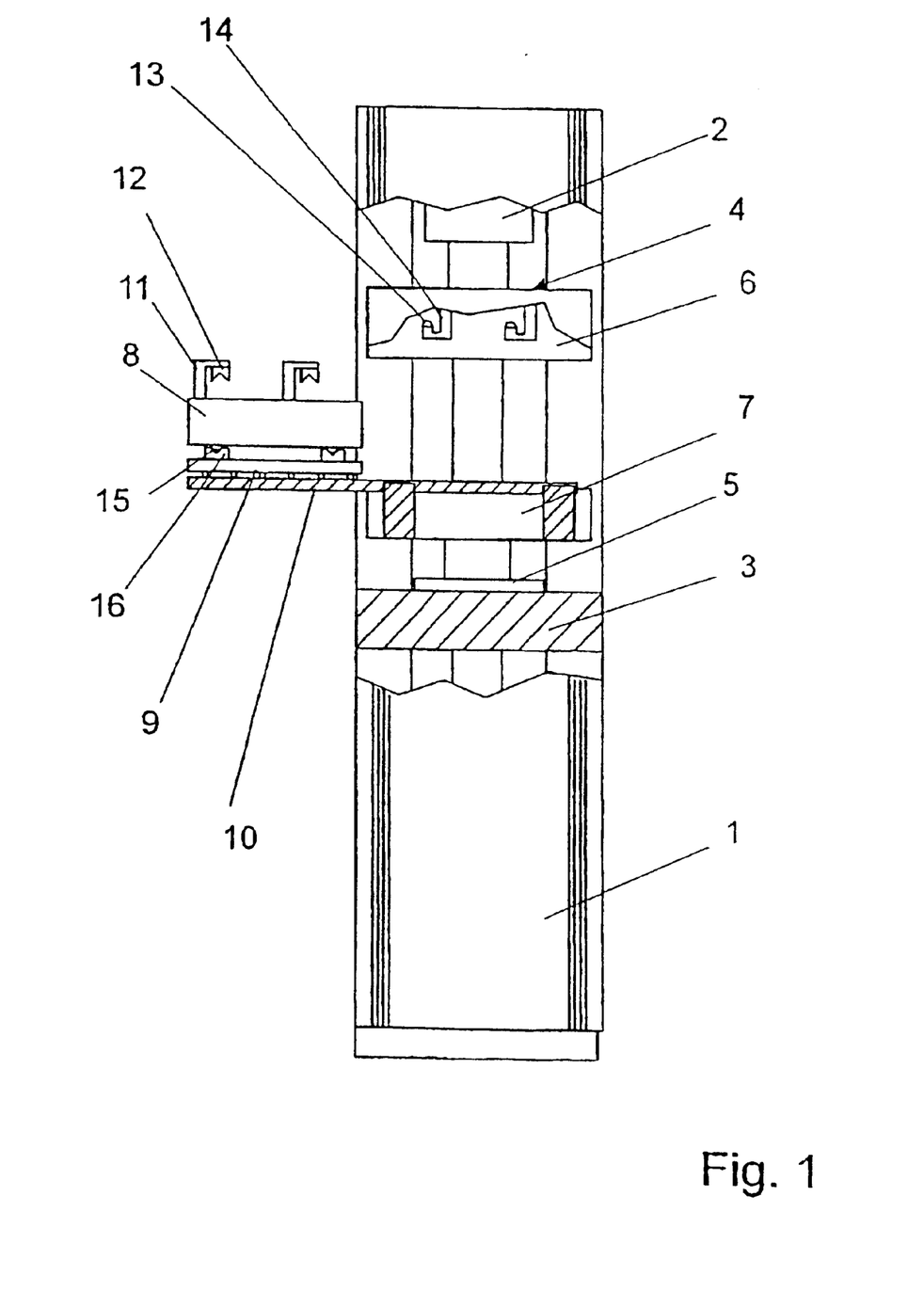
FIG. 1 shows a basic representation of an installation for molding microstructures.

In the case of the molding installation represented in FIG. 1, a load frame 1 supports a part 2 which is fixed to the framework and a part 3 which is adjustable, to which parts an upper flange 4 and a lower flange 5 are fastened. The flanges 4, 5 serve for the securing of oppositely lying chamber parts 6, 7 of a closable chamber, which in the present exemplary embodiment is designed as a vacuum chamber. Instead of the vacuum chamber, however, a chamber which can be filled with inert gas, for example, is also suitable for molding purposes.

With the cooperation of devices not represented, such as a device for force measurement, an evaluating and activating unit and a device for path measurement, the part 3 which is adjustable can be displaced with respect to the part 2 which is fixed to the framework by a drive integrated into the frame 1, whereby closing and opening of the chamber is made possible. The evaluating and activating unit controls, inter alia, the positioning of the part 2 which is fixed to the framework in relation to the part 3 which is adjustable and serves with the device for force measurement for maintaining a defined force between the part 2 which is fixed to the framework and the part 3 which is adjustable.

It is immediately evident to a person skilled in the art that the part 2 which is fixed to the framework and the part 3 which is adjustable can be changed over in their arrangement.

Figure 2:
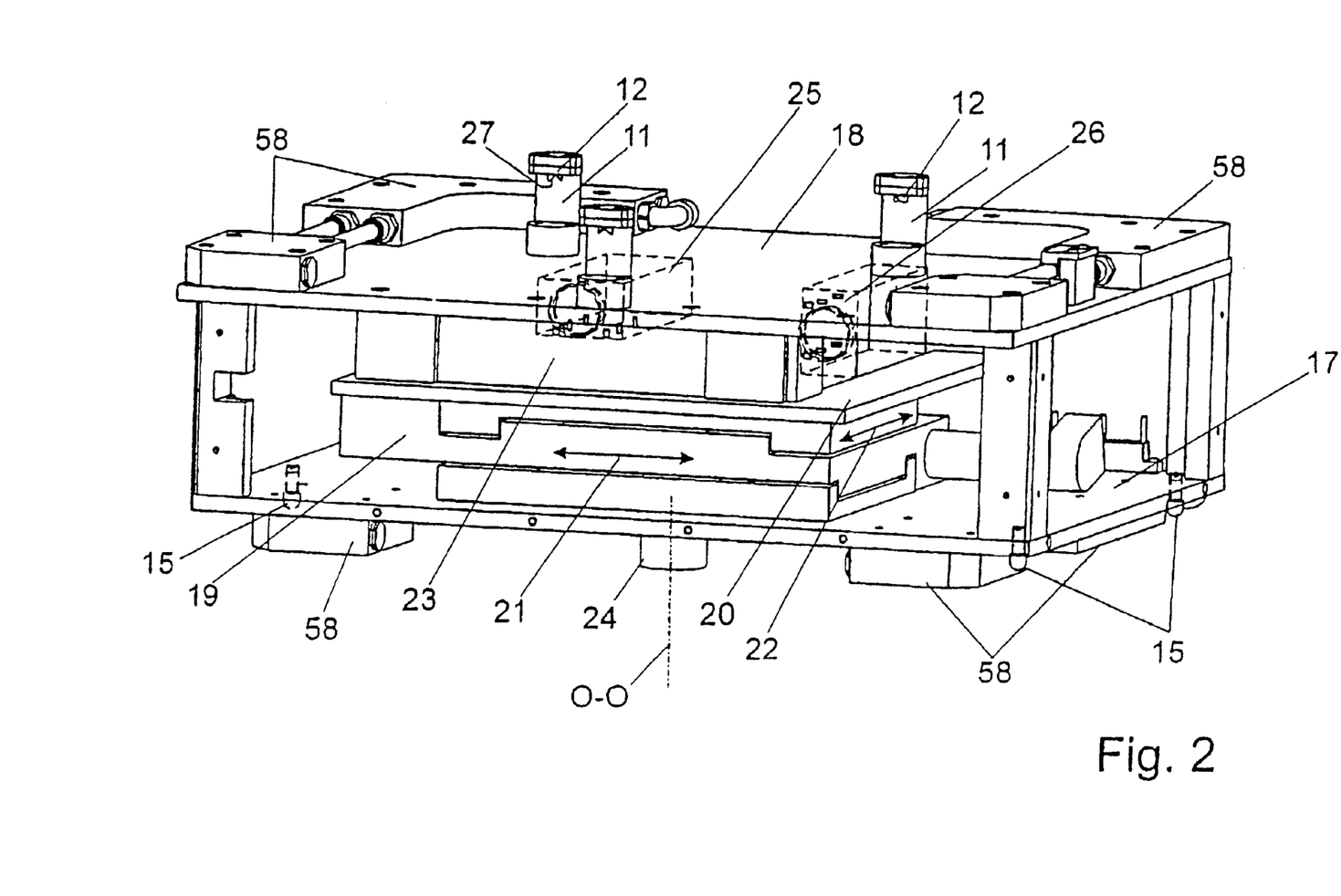
FIG. 2 shows a perspective representation of a measuring system for the positional determination of selected microstructures in a plane.

A measuring system 8, to be described in further detail in FIG. 2, is placed in a removable way onto a mobile framework 9, the underlay 10 of which is fastened to the lower chamber part 7. The mobility of the measuring system 8 serves the purpose of moving of the latter into the molding region between the two chamber parts 6, 7 when the chamber is open and out of it again. Hooks 11 provided in the upper region of the measuring system 8 have at their ends bearing surfaces 12, which are shaped as a three-point bearing in a way corresponding to hemispherical bearing surfaces 13 on hooks 14, which are attached to the upper flange 4. In the hung-in state, a defined positional relationship is established between the measuring system 8 and the upper flange 4. The lower region of the measuring system 8 has hemispherical aligning elements 15, which rest on positioning elements 16 in a three-point formation during the moving-in and moving-out operation and align the measuring system 8 on the framework 9 and consequently also in relation to the underlay 10.

The measuring system 8 itself comprises a housing with a bottom plate 17 and a top plate 18. This housing can be shielded against external influences by a cladding (not represented) on one or more sides.

An electrically operated mechanical stage 19, which can adjust a stage plate 20 parallel to the bottom plate 17 in two directions of movement 21, 22 perpendicular to each other is mounted on the bottom plate 17.

The stage plate 20 serves as a support for a measuring microscope 23, the objective 24 of which has an optical axis O—O directed perpendicularly with respect to the bottom plate 17. An opening, which cannot be seen in FIG. 2, in the bottom plate 17 ensures the passage of the beam necessary for measuring purposes. The mechanical stage 19 also has in its central region an opening provided for this purpose. The size of the openings ensures unhindered movement of the objective 24 over the entire range of movement in the directions of movement 21, 22.

A defined positioning of the mechanical stage 19 takes place with the aid of the equipment software.

A low overall height of the measuring microscope 23 is achieved by a beam running in a horizontal direction on the image side with respect to the objective 24. Following the deflection of the optical axis O—O into a direction parallel to the stage plate, the beam is split into two separate optical branches, each of which contains a CCD camera 25 and 26, respectively, the position of which is indicated by dashed lines. Different magnifications are used in the optical branches, so that easy searching for microstructures of a viewed object is possible within the image field of the first CCD camera 25. The magnification of the second branch is made such that exact measurement of the positional relationships of the structures on the object is possible within the image field of the second CCD camera 26.

The measuring microscope 23 operates with an illuminating system for a bright-field/incident-light illumination. The light is provided by means of a first fibre-optic cable (not represented) from a suitable first light source. In addition, a ring light (not represented), which is fed by means of a second fabric-optic cable (not represented) from a second suitable light source, may be attached to the objective 24. Consequently, the use of a dark-field/incident-light illumination is also possible.

It can be seen more clearly from FIG. 2 that the bearing surfaces 12 provided at the hooks 11 have notches 27 aligned in a manner in which they are offset in relation to one another by approximately 120°. Of the hemispherical aligning elements 15 attached to the opposite sides of the bottom plate 17, one element is fastened on one side and two elements are fastened on the opposite side.

Figure 3:
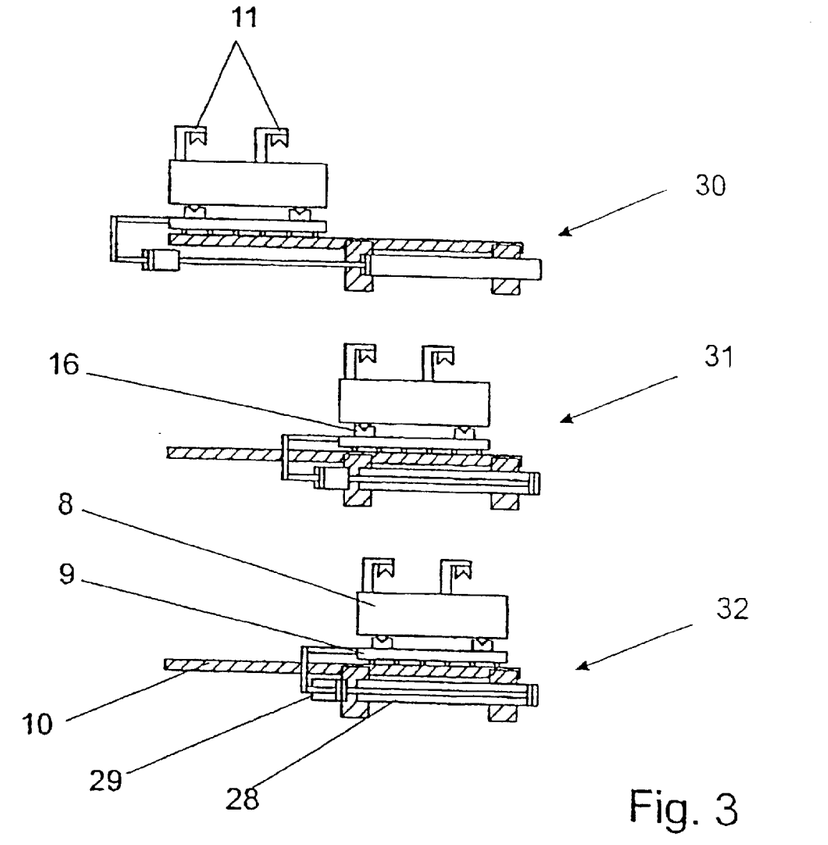
FIG. 3 shows a device for transporting the measuring system into the molding region and out of this region.

A transporting device schematically represented in FIG. 3 comprises the underlay 10, fastened to the lower chamber part 7, for receiving the mobile framework 9 and pneumatic drives 28, 29. The first drive 28 serves the purpose of displacing the mobile framework 9 on the underlay 10 from a parking position 30, lying outside the molding region, into an intermediate position 31, which already lies within this region.

The second drive 29 undertakes the transport from the intermediate position 31 into a hanging-in position 32, in which the measuring system can be hung by its hooks 11 onto the hooks 14 of the upper flange 4.

Figure 4:
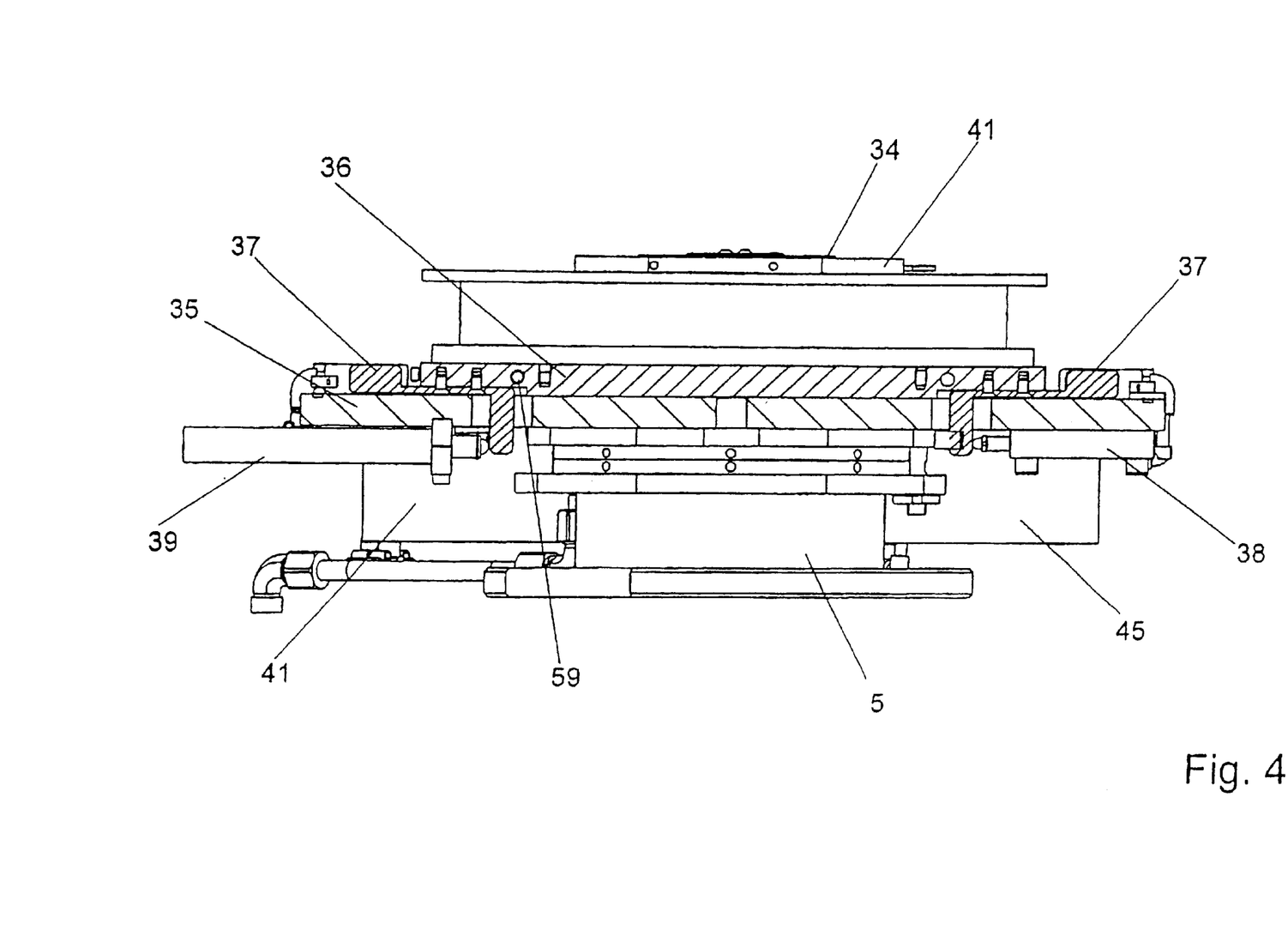
FIG. 4 shows a device for displacing a substrate to be molded in relation to the tool as an integrated component part of the lower chamber part of the molding installation.
Figure 5:
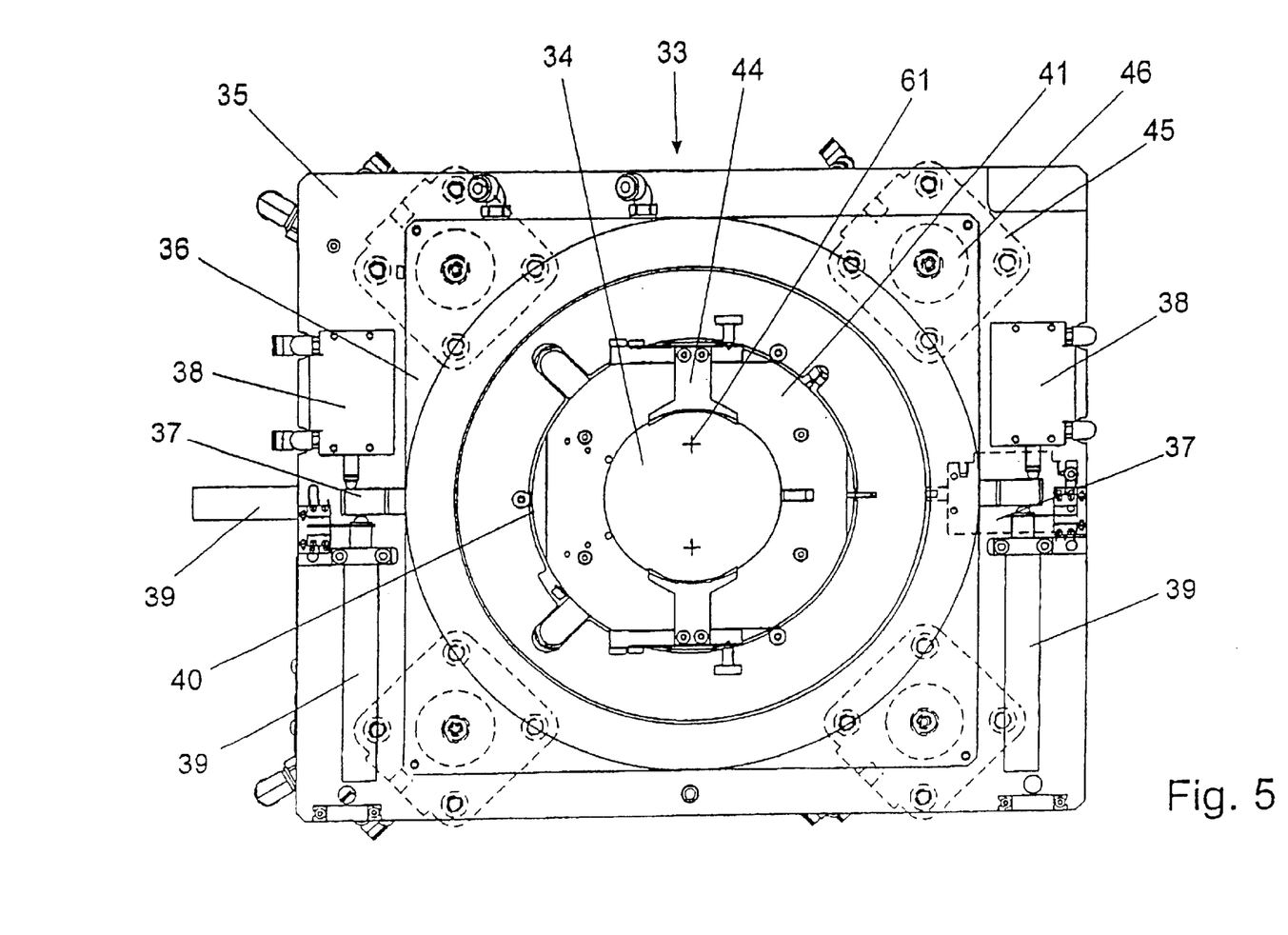
FIG. 5 shows a plan view of the device according to FIG. 4.
Figure 7:
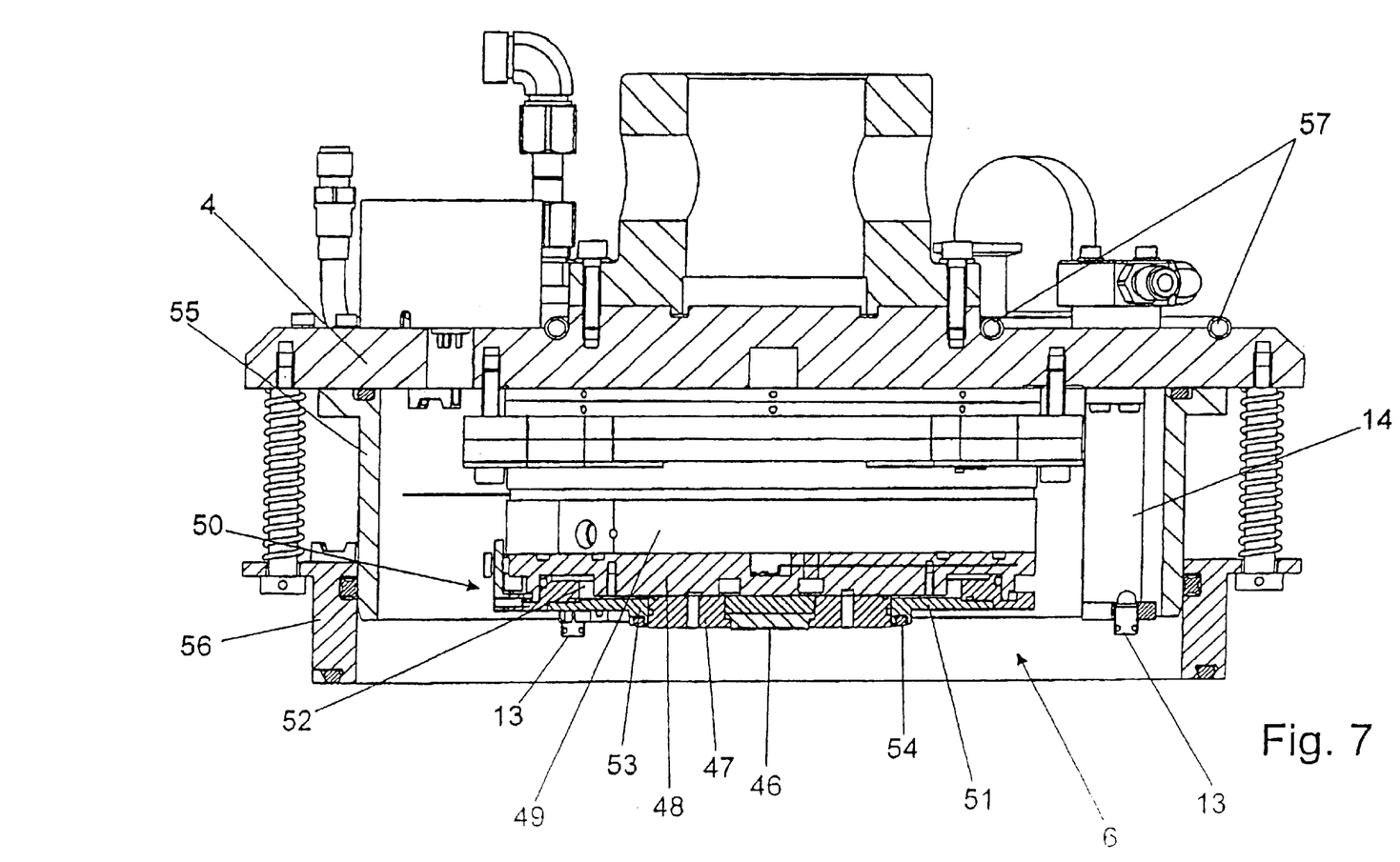
FIG. 7 shows the upper chamber part of the molding installation.

The molding installation contains in the lower chamber part 7, as a further subdevice, a displacing device 33 according to FIGS. 4 and 5, with which a substrate 34 to be molded can be adjusted in a plane perpendicularly with respect to the closing direction of the chamber with respect to a tool denoted in FIG. 7 by 46.

Of two sliding plates 35, 36 which lie one on top of the other and are movable in relation to each other parallel to the plane of the substrate displacement, stops 37 are provided for the upper sliding plate 36 and are respectively brought by pneumatic cylinders 38 up against a drive unit 39, serving as a position encoder, on the sliding plate 35. Suitable measuring means (not represented) monitor the positions set by the drive unit 39. The upper sliding plate 36 supports a lower part 40 of a heating and cooling unit, which is necessary for the molding and on which a substrate holder 41 is mounted. On the substrate holder 41, the substrate 34, which, as can be seen from FIG. 6, comprises a supporting layer 42 and a moldable material 43, can be fixed with the aid of spring elements 44. Lateral stops (not represented) may be additionally provided. Usually, the supporting layer 42 consists of a structured material, such as for example a photolithographically structured ceramic plate or a structured printed-circuit board.

Figure 6:
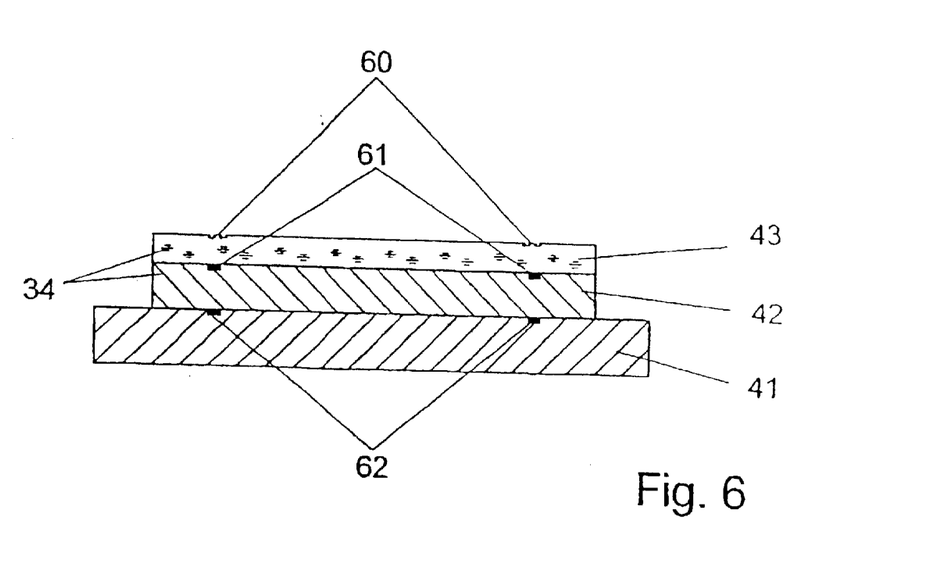
FIG. 6 shows a substrate holder with a substrate resting on it.

If the material 43 is to be molded on both sides, it is possible to replace the supporting layer 42 by a further tool.

The upper sliding plate 36 has the additional task of forming the lower termination of the chamber. If the chamber is operated under vacuum conditions, forces for which there are no counteracting forces act on the upper sliding plate 36 due to the atmospheric pressure. To exclude an undesired deformation of the chamber and to ensure a defined relative position of the two sliding plates 35, 36 in relation to each other, the upper sliding plate 36 can be pneumatically clamped to the lower sliding plate 35. The force necessary for this is produced by four pneumatic cylinders 45, fastened to the lower sliding plate 35.

The force available at the thrust rods of the pneumatic cylinders 45 is transferred by four clamping plates 46 onto the upper sliding plate 36.

According to FIG. 7, the upper chamber part 6 contains the tool 46 which is necessary for the molding and which is enclosed on its circumferential surface by a cylindrical tool holder 47, fastened on a base plate 48 in a sealed manner. The base plate 48 is in connection with the upper part 49 of a heating and cooling unit, which is fastened to the upper flange 4.

In the present exemplary embodiment, a demolding device 50 is additionally contained in the upper chamber part 6, of which device an annular demolding tool 51, which can be displaced parallel to the direction of the adjustment of the chamber parts 6, 7, encloses the tool holder 47. With an annular groove 52 machined into the base plate 48 and the lateral surface of the tool holder 47, the demolding tool 51 forms a pressure chamber into which a feed channel for compressed air is led through the base plate 48. The demolding tool 51, which has on its end face a projection 53 with a peripheral seal 54, bears in a sealed manner against the lateral surface of the tool holder 47 and against the outer cylindrical surface of the groove 52. This ensures that the demolding tool 51 can operate like the piston of a pneumatic cylinder. The range of movement is limited in one direction by the base plate 48 and in the other direction by stops (not represented). Restoring springs (not represented) serve the purpose of bringing the demolding tool 51 back into its position of rest after the feeding of compressed air has been ended.

The demolding device 50 serves the purpose of separating the substrate 34 from the tool 46 after the molding process, by the substrate 34 being pressed against the substrate holder 41 by the demolding tool 51, while at the same time the chamber is open. In addition, compressed air for assisting the detachment can be introduced into the space forming between the substrate 34 and the tool 46. For this purpose, the space forming is sealed towards the outside.

The hooks 14 with the hemispherical bearing surfaces 13 are fastened to the upper flange 4 in a manner in which they are respectively offset by 120°, so that only one is completely visible. An outwardly sealing side wall of the chamber is subdivided into wall parts 55, 56, of which the wall part 55 is attached to the flange 4 and the wall part 56 for closing the chamber comes to rest on a sealing outer region of the lower chamber part 7. Both wall parts 55, 56 are adjustable themselves in relation to each other in the direction of the adjustability of the chamber parts 6, 7, whereby the height of the chamber is variable.

When the structures of the tool 46 are being molded into the moldable material 43, heating and cooling outputs are introduced into the chamber. In order to achieve the accuracies necessary for the adjusted molding operation, in the present exemplary embodiment important parts of the measuring system 8, of the displacement device 33 and of the upper chamber part 6 are provided with channels for a temperature-controllable fluid, preferably water.

For instance, the flange 4 of the upper chamber part 6 has cooling channels 57 passing through it. The hooks 14 are also designed as cooling blocks and contain corresponding channels. Temperature-control blocks 58 are attached to the bottom plate 17 and to the top plate 18 of the measuring system 8. The sliding plates 35, 36 have suitable bores 59 for temperature control.

In addition to the function already mentioned, the evaluating and activating unit has a variety of further tasks, such as controlling the mechanical stage 19 and the measuring system 8, monitoring the positions of the two directions of movement 21, 22 of the mechanical stage 19, evaluating the information from the first and second CCD cameras 25, 26 with suitable image processing algorithms and controlling all the pneumatic units as well the drive units 39 and the position monitoring of the latter. The evaluation of the information from the first and second CCD cameras 25, 26 can be performed, for example, by the execution of the positioning and molding operation being carried out fully automatically. The evaluating and activating unit may, furthermore, be designed in such a way that the automatic finding of structures within the images of the CCD cameras 25, 26 is possible.

The following procedure serves for transferring the structures present on the tool 46 to the moldable material 43 with an exactly predeterminable locational position.

Once the substrate 34 has been put in place and fixed on the substrate holder 41 with the aid of the spring elements 44, the chamber is closed by adjusting the chamber parts 6 and 7 towards each other and subsequently evacuated.

During this operation, the adjustable part 3 is moved until the tool 46 and the moldable material 43 are touching. The height of the chamber is thereby adapted to the thickness of the moldable material 43 by the adjustability of the wall parts 55, 56 with respect to each other. Subsequently, a heating of the tool 46 and the moldable material 43 commences with the aid of the two parts 40 and 49 of the heating and cooling unit. The force effect brought about by a further adjustment of the part 3 and in cooperation with the evaluating and activating unit and also the device for force measurement has the effect of producing a defined pressing force between the substrate 43 and the tool 46, so that the intended structure transfer takes place. Once the transfer has been completed, a cooling phase and a subsequent admission of air to the chamber follow. With the aid of the demolding device 50, the moldable material 43 is separated from the tool 46.

For checking the result of the molding operation, the two chamber parts 6, 7 are brought to a distance at which not only is the measuring system 8 brought with the aid of the transporting device from the parking position 30 into the hanging-in position 32 suitable for measurement but it is also possible for the substrate 34 to be put into place and removed.

The measuring system 8 located in the parking position 30 together with the mobile framework 9 is moved between the two chamber parts 6, 7 into the intermediate position 31 by activating the first pneumatic drive 28. Subsequently, the lower chamber part 6 is adjusted towards the upper chamber part 7, whereby the transporting device and the measuring system 8 are moved along with it. The three hooks 11 fastened to the measuring system 8 enter the upper chamber part 7 until the notched bearing surfaces 12 are located above the bearing surfaces 13 fastened to the three hooks 14. The intermediate position 31 is chosen such that the hooks 11 and 14 do not collide with one another.

With the aid of the second pneumatic drive 29, the mobile framework 9 together with the measuring system 8 is brought into the hanging-in position 32, in which the bearing surfaces 12, 13 are located directly one above the other in the vertical direction. By lowering the lower chamber part 6, the hanging-in operation is completed.

Aligned in a defined manner with respect to the tool 46 and in all six lines of freedom, and decoupled from the mobile framework 9, the measuring system 8 now assumes a measuring position.

If, after carrying out measurements, the measuring system 8 is intended to be moved out again from the region between the two chamber parts 6, 7, the mobile framework 9 must firstly be brought into the hanging-in position 32 again. The lower chamber part 6 is adjusted together with the mobile framework 9 towards the upper chamber part 7, until the aligning elements 15 come to bear against the positioning elements 16. The coupling of the bearing surfaces 12, 13 is discontinued, after which the two surfaces lie one above the other in the vertical direction. While the second pneumatic drive 29 undertakes the transport into the intermediate position 31, the first pneumatic drive 28 brings the mobile framework 9 with the measuring system 8 into the parking position 30. When it is moved out into the parking position 30, the elements to be transported must be in a sufficiently large free space.

Since a direct ascertainment of the positional relationships between the tool 46 and the substrate 34 is not possible during the molding operation, it becomes necessary to ascertain the location coordinates of molded microstructures 60 on the moldable material and/or of already existing marks 61 on the supporting layer 42 before and after the molding operation in a trial molding operation preceding the actual molding operation. The respective substrate 34 can then be brought into the required position with respect to the tool 46 on the basis of the location coordinates ascertained, so that positioned molding can be achieved. Structures present on the tool 46 can be transferred to the moldable material 43 with an exactly predeterminable locational position.

For carrying out measurements on the microstructures 60, the marks 61 or on existing marks 62 on the substrate holder 41, the measuring microscope 24 is firstly brought into the measuring position and subsequently moved with the aid of the mechanical stage 19 over the supporting layer 42 in the directions of movement 21, 22, until the microstructures 60 to be measured, the marks 61 or the marks 62 are sensed. Focusing takes place by raising and lowering the lower chamber part 6. The data of the images recorded by the microscopic image formation of the CCD cameras 25, 26 are made available to the evaluating and activating unit for further processing, in particular for the positioning of the substrate 34 with the aid of the displacing device 33 required for locationally exact molding.

For the positioning operation, the clamping between the upper and lower sliding plates 35, 36 brought about by the four pneumatic cylinders 45 and the clamping plates 46 is discontinued. It is advantageous if the positional relationships between the marks 61 on the supporting layer 42 and the microstructures 60 of the tool 46 copied into the moldable material 43 are prescribed. The evaluating and activating unit is then capable of calculating the positions to be set of the substrate 34 fastened on the substrate holder 41, with the assistance of the location coordinates ascertained in the trial molding operation for the microstructures 60 and for the marks 61, and if need be for the marks 62, and of performing the activation of the drive units 39. The drive units 39 define by their setting the position into which the stops 37 for the upper sliding plate 36 are to be brought by the force of the pneumatic cylinders 38, whereby the substrate holder 41 with the substrate 34 is positioned in the translational coordinates and in the angular position with respect to the tool 46 in a plane parallel to the surface of the sliding plates 35, 36. Following the deactivation of the pneumatic cylinders 38, the position of the upper sliding plate 36 is initially maintained by the dead weight, before the restored clamping between the upper and lower sliding plates 35, 36 stabilizes the position of the upper sliding plate 36.

The set position can be checked by determining the coordinates of the marks 61 on the supporting layer 42 once again in the way already described. If appropriate, a repeated position setting with the displacing device 33 is required.

With the solution according to the invention, structures or objects contained on a support can be transferred with very high accuracy to predeterminable locations in a plastically deformable material. This is achieved by measurements of the location coordinates of the transferred structures or objects or of existing structures in the region of the transporting area and subsequent positioning of the region to be structured with respect to the support according to the measured location coordinates.

The measurements in the region of the transfer area must take place at such locations that the sensing of all the displacements having an effect on the location coordinates of the transferred structures or objects in a direction perpendicular to the direction of the transfer of the structures or objects is ensured.

In the present exemplary embodiment, the following procedures for the execution of the positioned molding operation are envisaged for this purpose:

In the simplest form, the basic principle, firstly a first substrate 34 is molded (rough molding) and then the position of the molded microstructures 60 in the moldable material 43 is measured. Once the marks 61 on the supporting layer have been measured with the aid of the displacing device, further substrates 34 to be processed are brought into the position in which the structures of the tool 46 are copied in a subsequent molding operation into the moldable material 43 in a defined distance-based relationship with respect to the marks 61. The coordinates of the structures 60 of the tool 46 copied into the moldable material 43 are known from the trial molding operation.

A first refinement of the positioned molding operation envisages measuring the positions of the marks 61 on thee supporting layer 42 before and after the trial molding of the first substrate 34 and the position of the molded microstructures 60 in the moldable material 43 and using the measurement results for aligning the further substrates 34 to be processed. This in turn involves firstly a determination of the location coordinates of the marks 61 as a basis for the required positioning with the displacing device 33. It is also advantageous if the structure positions in the supporting layer 42 and in the moldable material after the molding operation are sensed for the respectively following molding operation. This first refinement of the positioned molding achieves the effect that positional deviations of the substrate 34 with respect to the substrate holder 41 occurring in the molding process due to heating, cooling and molding do not act as defects.

In a repeated refinement of the molding process, the positions of the marks on the substrate holder 41 are also included. The marks 62 are already measured before the first substrate 34 is put in place. The positions of the marks on the substrate layer 42 before and after the molding operation and the position of the molded microstructures 60 in the moldable material 43 are then measured.

In the case of the further substrates 34 to be processed, the position of the marks 62 on the substrate holder 41 before the substrate 34 is put into place and the position of the marks of the supporting layer of the substrate 34 put into place are measured. Subsequently, positioning and molding are performed. After the molding operation, the positions of the marks in the supporting layer 42 and in the moldable material are sensed for the respectively following molding operation. The repeated refinement of the molding process achieves the effect that drift effects between the upper chamber part 6 and the measuring system 8 fixed to it during a measurement, on the one hand, and the lower chamber part 7 with the positioning system 33 fastened to it, on the other hand, do not act as defects.

While the foregoing description and drawings represent the present invention, it will be obvious to those skilled in the art that various changes may be made therein without departing from the true spirit and scope of the present invention.

What is claimed is:

1. A device for transferring microstructures from a tool to a substrate which is to be structured comprising:
   supports for the tool and the substrate which can be adjusted in relation to one another in a direction resulting in an alteration of the distance between the tool and the substrate;
   a measuring system for measuring selected locations in at least one measuring plane, in relation to which the direction of adjustment of the supports is directed vertically;
   said measuring system being able to be pushed in between said supports and, when in a measuring position, being in a fixed spatial relationship with the tool; and
   said substrate being able to be displaced parallel to the measuring plane for alignment with respect to the tool.

2. The device according to claim 1, wherein the support for the tool is contained in a first chamber part and the support for the substrate is contained in a second chamber part of a closable chamber, in which the transfer of the microstructures takes place by molding.

3. The device according to claim 2, wherein the chamber is designed as a vacuum chamber.

4. The device according to claim 2, wherein the chamber can filled with inert gas.

5. The device according to claim 1, wherein the measuring system includes various optical branches with image fields of different sizes, the magnification of a first optical branch permitting easy searching for the locations to be selected and that of a second optical branch permitting exact measurement of the selected locations in the measuring planes.

6. The device according to claim 5, wherein a transporting device which contains different drives for positions to be moved to one after the other is provided for the pushing in of the measuring system, a first drive undertaking the transport from a first position outside the chamber into a second position in the opened chamber and a second drive moving the measuring system into a position aligned in relation to the tool.

7. The device according to claim 6, wherein a device for displacing the substrate with respect to the tool is contained in the second chamber part and includes two sliding plates which lie one on top of the other, are movable in relation to each other parallel to the plane of the substrate adjustment and of which an upper sliding plate serves as a chamber-closing element.

8. The device according to claim 7, wherein the upper sliding plate can be clamped to the lower sliding plate.

9. The device according to claim 8, wherein the upper sliding plate supports a first part of a heating and cooling unit, on which a securing means for the substrate is fastened.

10. The device according to claim 9, wherein, for changing the height of the chamber, the chamber has side wall parts which provide a seal towards the outside and are themselves adjustable in relation to one another in the direction of the adjustability of the chamber parts.

11. The device according to claim 10, wherein the tool is enclosed on its circumferential surface by a cylindrical tool holder, which is fastened in the first chamber part to a plate-shaped body.

12. The device according to claim 11, wherein the plate-shaped body is in connection with a second part of a heating and cooling unit.

13. The device according to claim 12, wherein the tool holder is enclosed at the lateral surface by a demolding tool, which is displaceable with respect to the tool holder in the direction of the mutual adjustability of the supports for removing the substrate from the tool following the transfer of the microstructures.

14. The device according to claim 13, wherein the measuring system, the displacing device and the first chamber part contains channels for a temperature-controllable fluid.

15. The device according to claim 14, wherein, for establishing the fixed spatial relationship between the measuring system and the tool, hooks for hanging on correspondingly shaped hooks of the first chamber part are fastened to the measuring system in the upper region of the latter.

16. The device according to claim 14, wherein the substrate comprises a supporting layer and a moldable material applied to the latter.

17. The device according to claim 14, wherein a tool for transferring structures into the moldable material is applied to the supporting layer.

18. A method for transferring microstructures from a tool to a substrate which is structured, with supports for the tool and the substrate which can be adjusted in relation to one another in a direction resulting in an alteration of the distance between the tool and the substrate comprising the steps of:

ascertaining a positioning, required for the locationally exact transfer of the microstructures, of the substrate which is to be structured with respect to the tool in a plane in relation to which the direction of adjustment of the supports is directed vertically by correction values for the positioning, by the distance of the microstructure from a mark on the substrate, being formed from measured structure positions of transferred microstructures on a first structured substrate for at least one further substrate to be structured and;

transferring the microstructures.

19. The method according to claim 18, wherein, on the first substrate the positions of the marks are additionally ascertained before and after the transfer of the microstructures for forming correction values for the positioning.

20. The method according to claim 18, wherein the positions of marks on the substrate holder are additionally determined before a substrate is placed onto the substrate holder in order to serve as correction values.

21. The method according to claim 19, wherein, after the molding of each substrate, the positions of the molded microstructures and of the marks are determined as correction values for the positioning of the substrate which is to be respectively structured thereafter.

* * * * *